(12) United States Patent
Paek et al.

(10) Patent No.: US 8,513,885 B2
(45) Date of Patent: Aug. 20, 2013

(54) FRONT LIGHT UNIT

(75) Inventors: Seung Hwan Paek, Boryeong-si (KR); Woo-Bin Im, Chungcheongnam-do (KR); Chung-Hyoun Gyoung, Gyeonggi-do (KR); Tae-Su Kim, Chungcheongnam-do (KR); Hui Chul An, Boryeong-si (KR)

(73) Assignee: Neoviewkolon Co., Ltd, Chungcheongnam-Do (KR)

( * ) Notice: Subject to any disclaimer, the term of this patent is extended or adjusted under 35 U.S.C. 154(b) by 113 days.

(21) Appl. No.: 13/296,717

(22) Filed: Nov. 15, 2011

(65) Prior Publication Data
US 2012/0120657 A1 May 17, 2012

(30) Foreign Application Priority Data
Nov. 17, 2010 (KR) .................. 10-2010-0114582

(51) Int. Cl.
*H01J 63/04* (2006.01)

(52) U.S. Cl.
USPC ....... 313/512; 362/241; 362/247; 362/249.02

(58) Field of Classification Search
USPC .............. 362/236, 241, 247, 249.01, 249.02; 313/512
See application file for complete search history.

(56) References Cited

U.S. PATENT DOCUMENTS

| | | | |
|---|---|---|---|
| 2003/0193796 A1* | 10/2003 | Heeks et al. | .............. 362/84 |
| 2005/0023976 A1* | 2/2005 | Wang | ............... 313/512 |
| 2013/0038206 A1* | 2/2013 | Aurongzeb | ............. 313/512 |

\* cited by examiner

*Primary Examiner* — John A Ward
(74) *Attorney, Agent, or Firm* — Stein IP, LLC

(57) ABSTRACT

Disclosed herein is a front light unit including a transparent insulating substrate; a transparent anode electrode disposed on the insulating substrate; a plurality of organic light-emitting elements disposed on the anode electrode; a transparent cathode electrode disposed on the organic light-emitting elements; and a plurality of reflective plates disposed opposite the organic light-emitting elements in an emission direction of the organic light-emitting elements, and disposed between the insulating substrate and the cathode electrode.

13 Claims, 5 Drawing Sheets

(a)     (b)

FRONT LIGHT UNIT

CROSS-REFERENCE TO RELATED APPLICATIONS

This application claims the benefit of Korean Application No. 10-2010-0114582, filed Nov. 17, 2010, in the Korean Intellectual Property Office, the disclosure of which is incorporated herein by reference.

BACKGROUND OF THE INVENTION

1. Field of the Invention

The present invention relates generally to a front light unit and, more particularly, to a front light unit which comprises a transparent panel and reflective plates disposed on the transparent panel that have an almost invisibly small size, in which incident light is reflected by the reflective plates, thus enabling application of the front light unit to products having no backlight function.

2. Description of the Related Art

As is well known in the art, OLED is an acronym for Organic Light Emitting Diode, and refers to a self-emission display that emits light due to electrical excitation of a luminescent organic compound.

OLEDs can be driven at a low voltage, are thin, have a wide-viewing angle, fast response time, etc. and thus overcome the limitations of LCDs. The image quality of OLEDs can be equivalent or superior to that of a medium or small size thin film transistor-liquid crystal display (TFT-LCD), among other display devices. Attention is being drawn to OLEDs as a next generation display because of the advantages of OLEDs, which are that they can be manufactured by a simple manufacturing process and come to the fore in terms of future price competition.

In an OLED, an organic luminescent material is formed in a gap between a lower plate which is composed of a transparent glass substrate and an ITO transparent electrode pattern, serving as a positive electrode, formed on the transparent glass substrate and an upper plate which is composed of a substrate and a metal electrode, serving as a negative electrode, formed on the substrate. Thus, the OLED is a display device that employs emission of light caused by electric current flowing through the organic luminescent material when a certain voltage is applied between the transparent electrode and the metal electrode.

The conventional bottom-emission type transparent OLED employs a semi-transparent negative electrode.

SUMMARY OF THE INVENTION

Accordingly, the present invention has been made keeping in mind the above problems occurring in the prior art, and an object of the present invention is to provide a front light unit which comprises a transparent panel and reflective plates disposed on the transparent panel and having an almost invisibly small size so as to cause incident light to be reflected at the reflective plates and to be directed in a desired direction, thus enabling application of the front light to products having no backlight function.

The objects of the present invention are not limited to the above objects, and other objects which are not mentioned will be clearly appreciated from the following description by those skilled in the art.

The above object may be achieved by a front light unit according to the present invention, comprising: a transparent insulating substrate; a transparent anode electrode disposed on the insulating substrate; a plurality of organic light-emitting elements disposed on the anode electrode; a transparent cathode electrode disposed on the organic light-emitting elements; and a plurality of reflective plates disposed opposite the organic light-emitting elements in an emission direction of the organic light-emitting elements, and disposed between the insulating substrate and the cathode electrode.

The reflective plates may be disposed on the insulating substrate such that the reflective plates face the organic light-emitting elements, and the anode electrode may be disposed on the reflective plates.

The front light unit may further include a transparent anode auxiliary electrode interposed between the insulating substrate and the reflective plates.

In addition, the reflective plates may be disposed on the organic light-emitting elements, respectively, and the cathode electrode may be stacked on the reflective plates.

The front light unit may further include a transparent insulating layer disposed between the plurality of organic light-emitting elements.

The reflective plates and the organic light-emitting elements may be formed in dot shapes which are arranged at certain intervals.

The front light unit may further include a substrate, which is identical to the insulating substrate, disposed on the cathode electrode.

The insulating substrate may be formed of glass or plastic.

The reflective plates may be formed of one selected from the group consisting of Cr, Al, Ag, Au, Ta, and Mo.

The anode electrode may be formed of one selected from the group consisting of ITO, IZO, Mol, Cr, and Ag.

The anode electrode may be formed of one or a mixture of two or more selected from the group consisting of Au, Pt, Mg, Ag, Al, and inorganic oxides.

The front light unit may further include a transparent optical adjustment layer disposed between the reflective plates and the organic light-emitting elements.

The optical adjustment layer may be formed of one selected from the group consisting of $SiO_2$, $SiN_x$, $TiO_2$, $HfO_x$, $Al_2O_3$, and $Ta_2O_5$.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
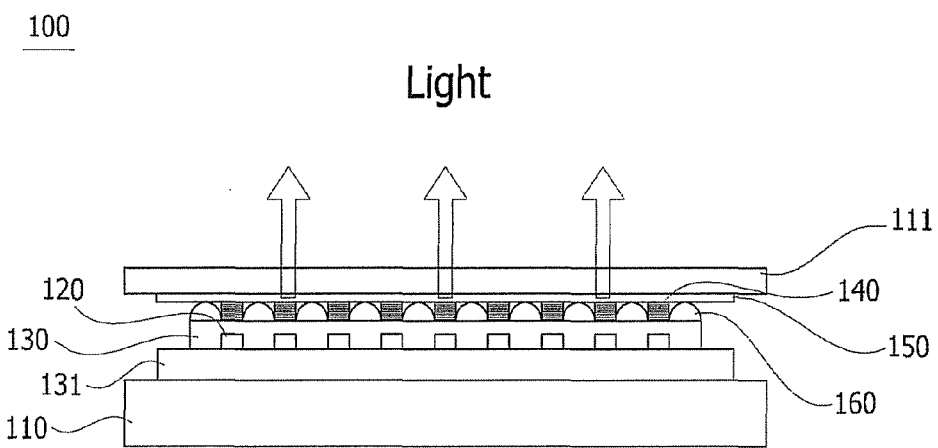
FIG. 1 is a view showing an overall configuration of a front light unit according to a first embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Although the terms used in the present invention are selected from generally known and used terms, some of the terms mentioned in the description of the present invention have been selected by the applicant at his or her discretion, and detailed meanings of these terms are described in relevant parts of the description. Furthermore, it is required that the present invention be understood, not simply by the actual terms used but by the meaning of each term.

Hereinafter, the technical configuration of the present invention will be described in detail with reference to the preferred embodiments which are shown in the accompanying drawings.

FIG. 1 is a view showing an overall configuration of a front light unit 100 according to a first embodiment of the present invention.

As shown in FIG. 1, in fabrication of the front light unit 100 according to the first embodiment of the present invention, an insulating substrate 110 is first prepared, and a plurality of reflective plates 120 are disposed on the insulating substrate 110.

Although the insulating substrate 110 may be formed of various materials that are transparent and insulation properties, the insulating substrate 110 in a preferred embodiment of the present invention is formed of transparent glass or plastic material.

The reflective plates 120 are disposed in plural numbers on the insulating substrate 110 so as to have a certain pattern.

Although the conventional transparent OLEDs that are normally used have a problem of reduced light emission efficiency, the reflective plates 120 according to the first embodiment functions to reflect the incident light directed toward itself upward and thus focus all the reflected light on an area where the light is needed, to thereby enhance the light emission efficiency.

Furthermore, the light-emitting area is small, and thus light directly irradiated to the eyes may be also removed to reduce eye fatigue.

Although the reflective plates 120 may be formed of various materials that may reflect light, one selected from the group consisting of Cr, Al, Ag, Au, Ta, and Mo may be used in preferred embodiments of the present invention.

In addition, an anode electrode 130 for injecting holes into organic light-emitting elements 140, which will be described later, is disposed on the reflective plates 120.

Although various electrodes may be used in the anode electrode 130, one selected from the group consisting of transparent ITO, IZO, MoI, Cr, and Ag may be used.

A transparent anode auxiliary electrode 131 may be further interposed between the insulating substrate 110 and the reflective plates 120 in order to efficiently apply a voltage to the anode electrode 130 through the anode auxiliary electrode 131, and the anode auxiliary electrode 131 is substantially identical to the anode electrode 130.

A plurality of organic light-emitting elements 140 are disposed on the anode auxiliary electrode 130.

The organic light-emitting elements 140 serve as a light-emitting part and may be made using various organic materials, and organic light-emitting materials for illuminating R (Red), G (Green), and B (Blue) colors may be appropriately arranged and used in order to implement a full-color OLED.

In addition, the organic light-emitting elements 140 are disposed to face the reflective plates 120, respectively, and light emitted from the organic light-emitting elements 140 may all be reflected in a certain direction. That is, the reflective plates 120 are disposed opposite the light-emitting face of the organic light-emitting elements 140, thus reflecting the emitted light.

Figure 3:
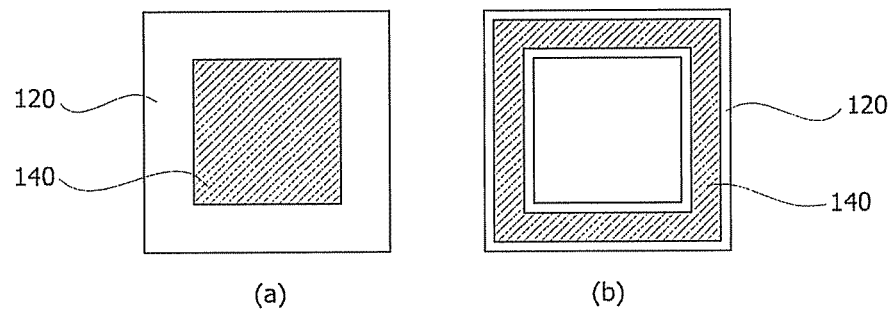
FIG. 3 is a plan view illustrating different shapes of a reflective plate and an organic light-emitting element according to an embodiment of the present invention.

The area of each of the reflective plates 120 may be equal to or larger than that of each of the organic light-emitting elements 140 by a certain proportion. Although the reflective plates 120 may have various shapes, they may be formed in a tetragonal shape or a picture frame shape in an embodiment of the present invention, as shown in FIG. 3.

Furthermore, although the reflective plates 120 and the organic light-emitting elements 140 may have various sizes within a range that does not affect the overall transmittance of the illumination, they are formed in a square shape or picture frame shape having a side dimension of 50 μm or less in a preferred embodiment of the present invention.

Figure 4:
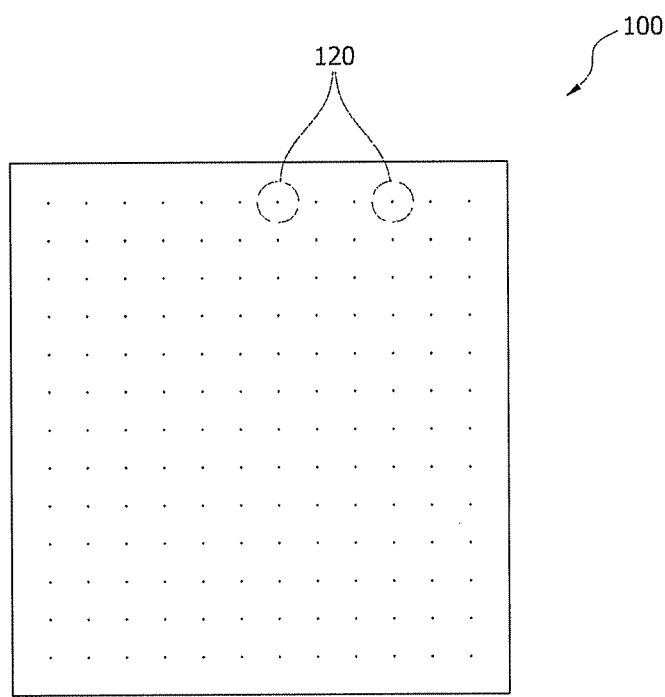
FIG. 4 is a view illustrating the arrangement of reflective plates and organic light-emitting elements according to the present invention.

Furthermore, the reflective plates 120 and the organic light-emitting elements 140 may be arranged in various patterns, and they are formed in dot shapes which are arranged at certain intervals, as shown in FIG. 4.

A cathode electrode 150 for injecting electrons into the organic light-emitting elements 140 is stacked on the organic light-emitting elements 140.

Although the cathode electrode 150 may be stacked as a result of using various materials for injecting electrons into the organic light-emitting elements 140, a transparent electrode 150 formed of one or a mixture of two or more selected from the group consisting of Au, Pt, Mg, Ag, Al, and inorganic oxides is provided in a preferred embodiment of the present invention.

An insulating layer 160 is formed of a transparent material and is additionally disposed between the organic light-emitting elements 140 in order to prevent the organic light-emitting elements 140 from interfering with each other.

Furthermore, a substrate 111, which is substantially identical to the insulating substrate 110, may be additionally stacked on the cathode electrode 150, so that a transparent OLED 100 in which reflective plates are provided according to the present invention may be protected from external impact to secure the durability of the OLED 100.

Hereinafter, a front light unit 100 according to a second embodiment of the present invention will be described in detail.

Figure 2:
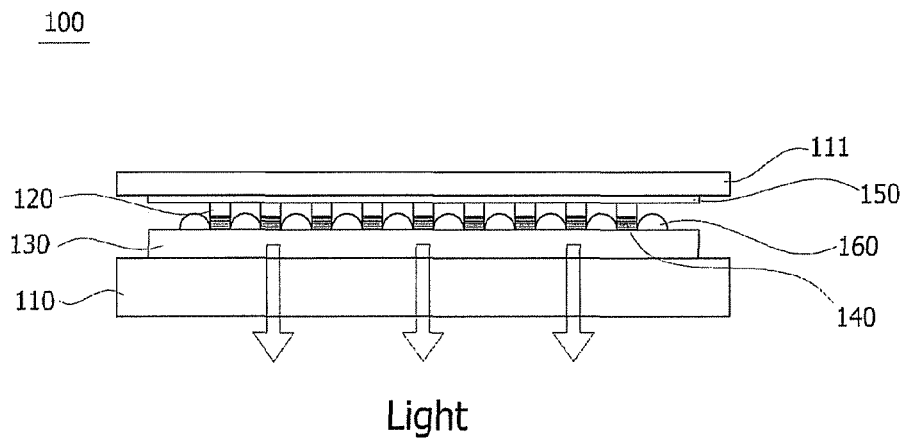
FIG. 2 is a view showing an overall configuration of a front light unit according to a second embodiment of the present invention.

First, FIG. 2 is a view showing an overall configuration of the front light unit 100 according to the second embodiment of the present invention. Referring to FIG. 2, a transparent anode electrode 130 is stacked on a transparent insulating substrate 110.

A plurality of organic light-emitting elements 140 are stacked on the anode electrode 130, and reflective plates 120 for reflecting light emitted from the organic light-emitting elements 140 are stacked on the organic light-emitting elements 140. That is, the reflective plates 120 are disposed opposite the light-emitting face of the organic light-emitting elements 140, thus reflecting the emitted light.

A transparent cathode electrode 150 is applied to the reflective plates 120.

Here, the reflective plates 120 not only reflect light, but also serve as a cathode electrode 150 for injecting electrons into the organic light-emitting elements 140.

The second embodiment of the present invention differs from the first embodiment as described above in terms of the stacking sequence or stacked structure of the components. Since the material and shape of the insulating layer 160, the cathode electrode 150, the substrate 111 stacked on the cathode electrode 150, and the other components as described above are all identical, the description thereof will be omitted.

Hereinafter, the operation of the front light unit 100 according to the embodiments of the present invention will be described in detail with reference to FIGS. 5a and 5b.

Figure 5A:
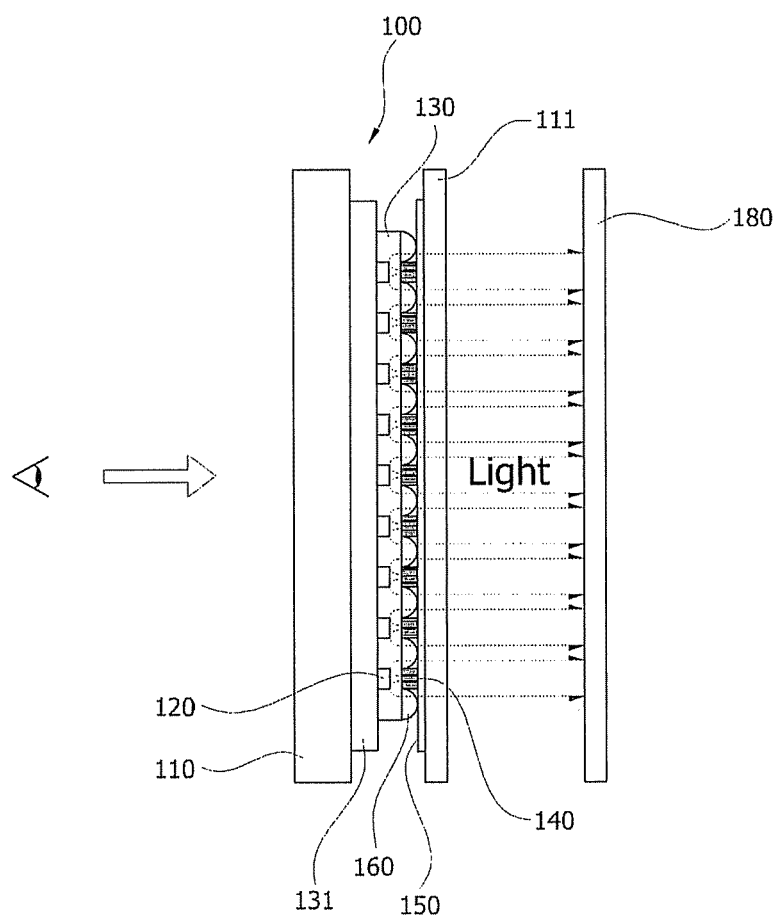
FIG. 5a is view illustrating the operation of the front light unit according to the first embodiment of the present invention.
Figure 5B:
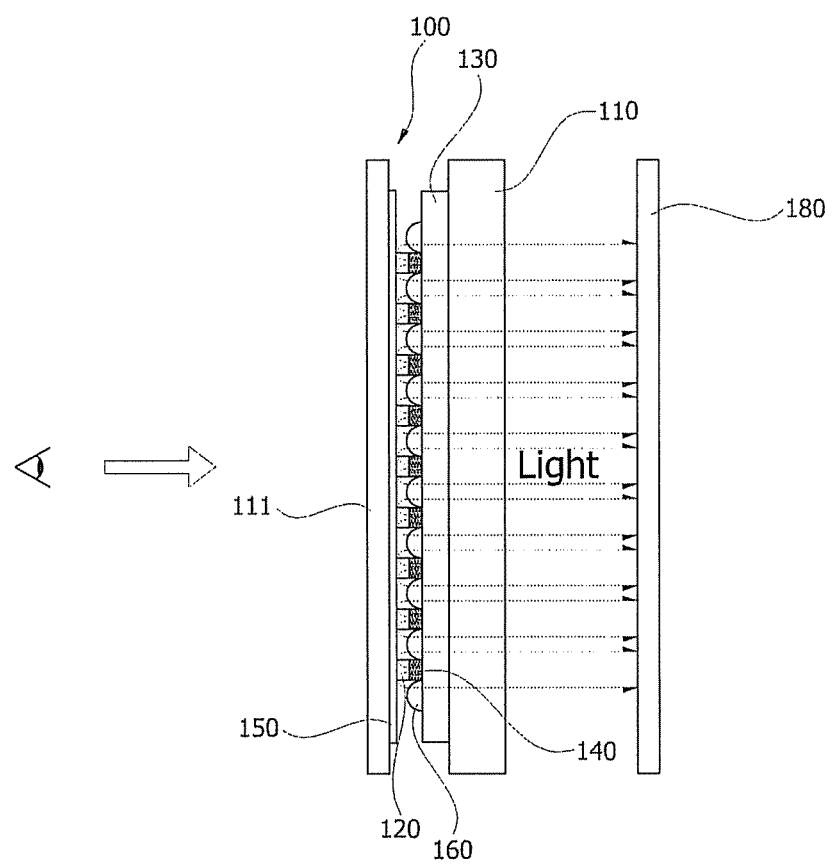
FIG. 5b is view illustrating the operation of the front light unit according to the second embodiment of the present invention.

First, FIG. 5a is a view illustrating the operation of the front light unit 100 according to the first embodiment of the present invention, and FIG. 5b is a view illustrating the operation of the front light unit 100 according to the second embodiment of the present invention.

As shown in FIGS. 5a and 5b, the front light unit 100 according to the embodiments of the present invention is constructed such that the light emitted from the organic light-emitting elements 140 is directed in a desired direction by the reflective plates 120 and is thus focused on a subject for the illumination of the subject, thereby enhancing the light emission efficiency.

Figure 6:
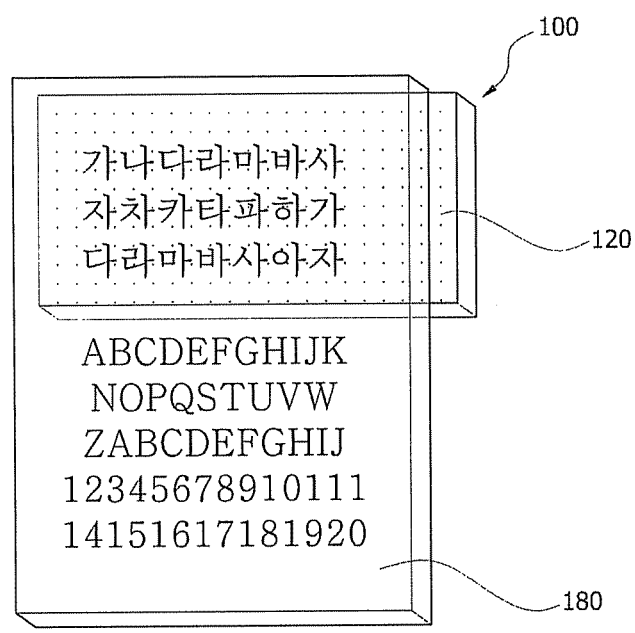
FIG. 6 is a view illustrating an actual use of a front light unit according to an embodiment of the present invention.

For reference, FIG. 6 is a view illustrating an actual use of a front light unit according to an embodiment of the present invention.

As shown in FIG. 6, the front light unit 100 according to the present invention allows people to read various books, E-paper, newspaper, magazines, etc. in the dark without additional illumination.

An optical adjustment layer for facilitating carrier injection may be further interposed between the reflective plates 120 and the organic light-emitting elements 140, and the optical adjustment layer is formed of one selected from the group consisting of $SiO_2$, $SiN_x$, $TiO_2$, $HfO_x$, $Al_2O_3$, and $Ta_2O_5$.

As described above, the present invention has the following excellent effects.

A front light unit according to the present invention has the excellent effects in that reflective plates having an almost invisibly small size is disposed on a transparent panel to cause light to reflected at the reflective plates, thus enabling application of the front light unit to products having no backlight function.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A front light unit, comprising:
    a transparent insulating substrate;
    a transparent anode electrode disposed on the insulating substrate;
    a plurality of organic light-emitting elements disposed on the anode electrode;
    a transparent cathode electrode disposed on the organic light-emitting elements; and
    a plurality of reflective plates disposed opposite the organic light-emitting elements in an emission direction of the organic light-emitting elements, and disposed between the insulating substrate and the cathode electrode.

2. The front light unit as set forth in claim 1, wherein the reflective plates are disposed on the insulating substrate such that the reflective plates face the organic light-emitting elements, and the anode electrode is disposed on the reflective plates.

3. The front light unit as set forth in claim 2, further comprising a transparent anode auxiliary electrode interposed between the insulating substrate and the reflective plates.

4. The front light unit as set forth in claim 1, wherein the reflective plates are disposed on the organic light-emitting elements, respectively, and the cathode electrode is disposed on the reflective plates.

5. The front light unit as set forth in claim 1, wherein a transparent insulating layer is further disposed between the plurality of organic light-emitting elements.

6. The front light unit as set forth in claim 1, wherein the reflective plates and the organic light-emitting elements are formed in a dot type at certain intervals.

7. The front light unit as set forth in claim 1, wherein a substrate identical to the insulating substrate is further stacked on the cathode electrode.

8. The front light unit as set forth in claim 7, wherein the insulating substrate is formed of glass or plastic.

9. The front light unit as set forth in claim 1, wherein the reflective plates are formed of one selected from the group consisting of Cr, Al, Ag, Au, Ta, and Mo.

10. The front light unit as set forth in claim 1, wherein the anode electrode is formed of one selected from the group consisting of ITO, IZO, Mol, Cr, and Ag.

11. The front light unit as set forth in claim 1, wherein the anode electrode is formed of one or a mixture of two or more selected from the group consisting of Au, Pt, Mg, Ag, Al, and inorganic oxides.

12. The front light unit as set forth in claim 1, wherein a transparent optical adjustment layer is further disposed between the reflective plates and the organic light-emitting elements.

13. The front light unit as set forth in claim 12, wherein the optical adjustment layer is formed of one selected from the group consisting of $SiO_2$, $SiN_x$, $TiO_2$, $HfO_x$, $Al_2O_3$, and $Ta_2O_5$.

* * * * *